(12) United States Patent
Wang

(10) Patent No.: US 7,872,403 B2
(45) Date of Patent: Jan. 18, 2011

(54) METHOD FOR MANUFACTURING PIEZOELECTRIC FILM ELEMENT, AND PIEZOELECTRIC FILM ELEMENT

(75) Inventor: Xiaoxing Wang, Chino (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 12/254,921

(22) Filed: Oct. 21, 2008

(65) Prior Publication Data

US 2009/0100656 A1  Apr. 23, 2009

(30) Foreign Application Priority Data

Oct. 23, 2007  (JP) .............................. 2007-274651

(51) Int. Cl.
*H01L 41/187* (2006.01)
(52) U.S. Cl. ............ 310/358; 252/62.9 R; 252/62.9 PZ
(58) Field of Classification Search ................. 310/358; 252/62.9 PZ, 62.9 R
See application file for complete search history.

(56) References Cited

U.S. PATENT DOCUMENTS

| | | | |
|---|---|---|---|
| 5,821,005 A | | 10/1998 | Kijima et al. |
| 6,333,066 B1 * | | 12/2001 | Kim .......................... 427/126.3 |
| 7,279,825 B2 * | | 10/2007 | Ifuku et al. .................. 310/358 |
| 7,312,558 B2 * | | 12/2007 | Fujii et al. ................... 310/358 |
| 7,494,601 B2 * | | 2/2009 | Wang et al. ............. 252/62.9 R |
| 7,766,464 B2 * | | 8/2010 | Noguchi et al. ................ 347/72 |
| 2005/0218466 A1 * | | 10/2005 | Kondo et al. ................. 257/415 |
| 2008/0123243 A1 * | | 5/2008 | Hamada et al. ........... 361/301.1 |
| 2008/0224571 A1 * | | 9/2008 | Miyazawa et al. .......... 310/358 |
| 2009/0160914 A1 * | | 6/2009 | Fujii ............................ 347/68 |
| 2009/0244213 A1 * | | 10/2009 | Shimada ....................... 347/71 |
| 2010/0147789 A1 * | | 6/2010 | Kurachi et al. ................ 216/13 |
| 2010/0155647 A1 * | | 6/2010 | Saito et al. ............ 252/62.9 PZ |

FOREIGN PATENT DOCUMENTS

| | | |
|---|---|---|
| JP | 08-306231 | 11/1996 |
| JP | 2004-296679 | 10/2004 |
| JP | 2005-159309 | 6/2005 |
| JP | 2005-255424 | 9/2005 |

* cited by examiner

*Primary Examiner*—J. SanMartin
(74) *Attorney, Agent, or Firm*—Harness, Dickey & Pierce, P.L.C.

(57) ABSTRACT

A method for manufacturing a piezoelectric film element includes foursteps. The first is to form a bottom electrode on a Si substrate. The second is to form a seed layer with a layered perovskite structure on the bottom electrode. The third is to form a $Bi_4Ti_3O_{12}$—$BaBi_4Ti_4O_{15}$ based piezoelectric film on the seed layer. The final step is to form an top electrode on the piezoelectric film.

8 Claims, 3 Drawing Sheets

METHOD FOR MANUFACTURING PIEZOELECTRIC FILM ELEMENT, AND PIEZOELECTRIC FILM ELEMENT

The entire disclosure of Japanese Patent Application No. 2007-274651, filed Oct. 23, 2007 is expressly incorporated by reference herein.

BACKGROUND

1. Technical Field

The present invention relates to methods for manufacturing piezoelectric film elements, and piezoelectric film elements.

2. Related Art

As a piezoelectric material used for ink jet recording heads, lead zirconate titanate (hereafter referred to as "PZT") has been most widely used because of its excellent piezoelectric characteristic (see Japanese Laid-open Patent Applications JP-A-2004-296679 and JP-A-2004-159309, for example). However, in recent years, piezoelectric materials that do not contain lead have been desired in place of PZT, because lead would elute when lead-containing wastes are exposed to acid rain or the like, and cause serious harm to the environment.

Recently, layered ferroelectrics containing bismuth have been reported as piezoelectric materials that do not contain lead and have excellent piezoelectric characteristic (see Japanese Laid-open Patent Applications JP-A-2005-255424, for example). Such ferroelectrics have a structure in which bismuth oxide layers and perovskite layers are alternately laminated, and those of the ferroelectrics with $TiO_6$ octahedron layers that form the perovskite layers in a number of 1-5 are known.

However, it is necessary to control the crystal orientation of the ferroelectric film in order to enhance its piezoelectric characteristic.

SUMMARY

In accordance with an advantage of some aspects of the invention, a piezoelectric film element that does not contain lead, and has high Curie temperature and excellent piezoelectric characteristic, and a method for manufacturing such a piezoelectric film element can be provided.

A method for manufacturing a piezoelectric film element in accordance with an embodiment of the invention includes the steps of: forming a bottom electrode on a base substrate; forming a seed layer having a layered perovskite structure on the bottom electrode; forming a piezoelectric film composed of $Bi_4Ti_3O_{12}$—$BaBi_4Ti_4O_{15}$ on the seed layer; and forming an top electrode on the piezoelectric film.

According to the present embodiment of the invention, the $Bi_4Ti_3O_{12}$—$BaBi_4Ti_4O_{15}$ based piezoelectric film is formed on the seed layer having a layered perovskite structure, whereby it can be oriented in an a/b axis or an a-axis. As a result, the $Bi_4Ti_3O_{12}$—$BaBi_4Ti_4O_{15}$ based piezoelectric film with excellent piezoelectric characteristic can be obtained.

In the method for manufacturing a piezoelectric film element in accordance with the present embodiment, the composition of the seed layer can be expressed by a general formula $Bi_{1-x}Pr_xTi_3O_{12}$ (x in the formula is between 0.1 and 0.7).

In the method for manufacturing a piezoelectric element in accordance with the present embodiment, the piezoelectric film may be formed by a sol-gel spin coating method or a sol-gel dipping method.

In the method for manufacturing a piezoelectric film element in accordance with the present embodiment, the sol-gel liquid may include at least one of polymers selected from polyvinyl pyrrolidone, polyacrylic acid, polyethylene glycol, and polyvinyl alcohol.

In the method for manufacturing a piezoelectric element in accordance with the present embodiment, the average molecular weight of the polymer may be 300,000-1,500,000.

In the method for manufacturing a piezoelectric film element in accordance with the present embodiment, the sol-gel liquid may contain the polymer by 0.5-5 weight %.

A piezoelectric film element in accordance with an embodiment of the invention includes: a bottom electrode; a seed layer formed on the bottom electrode with the composition expressed by a general formula $Bi_{1-x}Pr_xTi_3O_{12}$ (x in the formula is a number between 0.1 and 0.7); a $Bi_4Ti_3O_{12}$—$BaBi_4Ti_4O_{15}$ based piezoelectric film formed on the seed layer; and a top electrode formed on the piezoelectric film.

In the piezoelectric element in accordance with the present embodiment, the bottom electrode may be composed of iridium.

In the piezoelectric element in accordance with the present embodiment, the top electrode may be composed of platinum.

DESCRIPTION OF EXEMPLARY EMBODIMENTS

Figure 1:
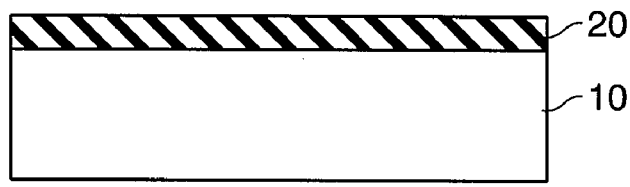
FIG. 1 is a schematic cross-sectional view of a piezoelectric element in an ink jet recording head in a manufacturing step in accordance with an embodiment of the invention.

Preferred embodiments of the invention are described below with reference to the accompanying drawings.

A piezoelectric film in accordance with an embodiment of the invention may be formed by a sol-gel spin coating method or a sol-gel dipping method. Firstly, a method for preparing the sol-gel liquid is described.

1. Preparation of Sol-Gel Liquid

The sol-gel liquid may be prepared by mixing organometallic compounds, partial hydrolysates thereof and/or polycondensates thereof containing the metals at a desired molar ratio, and then dissolving or dispersing the mixture using an organic solvent such as alcohol. The organometallic compounds to be used may preferably be stable in a solution state.

The organometallic compounds that are usable in the present embodiment may be those that can generate metal oxides originated from the organometallic compounds through hydrolysis or oxidation, and may be selected from alkoxides, organometallic complexes and organic acid salts of the metals.

A method for preparing a sol-gel liquid of $Bi_4Ti_3O_{12}$—$BaBi_4Ti_4O_{15}$ (hereafter also referred to as "BiTBBTi") is concretely described below.

(1) An organometallic compound containing Ba, an organometallic compound containing Bi, and an organometallic compound containing Ti are mixed together at a desired metal molar ratio, and then the mixture is dissolved or dispersed using an organic solvent such as alcohol to form an alkoxide solution.

As the organometallic compound containing Ba, for example, alkoxide compounds (such as Ba ethoxide and so on), and barium carbonate may be used.

As the organometallic compound containing Bi, for example, alkoxide compounds (Bi trimethoxide, Bi ethoxide, Bi tripropoxide, and the like), bismuth oxide, bismuth nitrate, bismuth chloride, and bismuth hydroxide may be used.

As the organometallic compound containing Ti, for example, alkoxide compounds (such as Ti tetraisopropoxide and so on), acetate, and octil salt may be used.

As the organic solvent, for example, alcohols, such as methanol, ethanol, propanol, n-butanol and isopropanol and so on; ketones, such asacetones and methyl ethyl ketone and so on; ethers, such as dimethyl ether and diethyl ether and so on; cycloalkans, such as cyclohexane and cyclohekisanol and so on; aromatic compounds, such as benzene, toluene, xylene and so on; carboxylic acids; esters; and tetorahidorofran may be used. By using alcohols as the solvent, metal alkoxides can be dissolved well.

(2) When hydrolysis and polycondensation are to be carried out, an appropriate amount of water is added to the alkoxide solution described above, and an acid or an alkaline is added as catalysis, whereby the sol-gel liquid of BiTBBTi can be prepared.

(3) In addition to the additive described above, at least one of polymers selected from polyvinylpyrrolidone, polyacrylic acid, polyethylene glycol, and polyvinyl alcohol may be added to the sol-gel liquid of BiTBBTi in accordance with the present embodiment. Generally, defects called microcracks may be generated during the formation of a BiTBBTi piezoelectric film. By adding the polymer described above to the sol-gel liquid, generation of microcracks can be controlled.

The average molecular weight of the polymer described above may preferably be 300,000-1,500,000, and more preferably 500,000-1,000,000. When the average molecular weight of the polymer is within the range described above, generation of microcracks can be effectively suppressed. When the average molecular weight of the polymer exceeds 1,500,000, the viscosity of the sol-gel liquid becomes too high, which makes the sol-gel liquid difficult to be coated on the seed layer. On the other hand, when the average molecular weight of the polymer is less than 300,000, the effect of suppressing the microcracks diminishes.

The addition amount of the polymer may preferably be 0.5-5 wt % of the weight of the sol-gel liquid. When the amount of the polymer to be added is within the aforementioned range, generation of microcracks can be effectively suppressed. When the amount of the polymer to be added exceeds 5 weight %, the viscosity of the sol-gel liquid becomes too high, which makes the sol-gel liquid difficult to be coated on the seed layer. On the other hand, when the amount of the polymer to be added is less than 0.5 wt %, generation of microcracks may not be controlled.

2. Method For Manufacturing Piezoelectric Film Element

A method for manufacturing a piezoelectric film element in the present invention includes the steps of:

(a) forming a bottom electrode on a Si substrate (b) forming a seed layer with a layered perovskite structure on the bottom electrode (c) forming a $Bi_4Ti_3O_{12}$—$BaBi_4Ti_4O_{15}$ piezoelectric film on the seed layer (d) forming an upper electrode on the piezoelectric layer The method for manufacturing a piezoelectric film element in accordance with the embodiment is concretely described below. FIGS. 1-6 are schematic cross-sectional views of a piezoelectric film element in an ink jet recording head in the manufacturing process in accordance with an embodiment of the invention.

(1) First, a pressure chamber substrate 10 is prepared. As the pressure chamber substrate 10, for example, a silicon single crystal substrate having a thickness of 200 µm is used.

Next, as shown in FIG. 1, a vibration plate 20 is formed on the pressure chamber substrate 10. As a method of forming the vibration plate 20, a known method, for example, a method of forming a silicon dioxide layer by thermal oxidation, a CVD (chemical vapor deposition) method, or the like may be used.

As the material for the vibration plate 20, for example, silicon dioxide and zirconium oxide may be used. The vibration plate 20 may be in a two-layer structure having a film of silicon dioxide in a thickness of about 1000 nm and a film of titanium in a thickness of about 400 nm.

In the present embodiment, members including the pressure chamber substrate 10 and the vibration plate 20 are referred to as a Si substrate.

Figure 2:
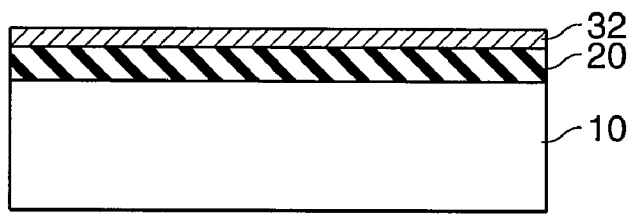
FIG. 2 is a schematic cross-sectional view of the piezoelectric element in an ink jet recording head in a manufacturing step in accordance with the embodiment of the invention.

(2) As shown in FIG. 2, a bottom electrode 32 is formed on the vibration plate 20. The bottom electrode 32 may be formed by a known method, for example, a sol-gel method, a laser ablation method, a sputter method, a MOCVD method or the like. As the material for the bottom electrode 32, for example, platinum, iridium, titanium or the like having conductivity may be used. The bottom electrode 32 may be in a two-layer structure having a platinum layer and an iridium layer, and its thickness of may be about 200 nm. However, a single platinum or a single iridium electrode may be used instead.

Figure 3:
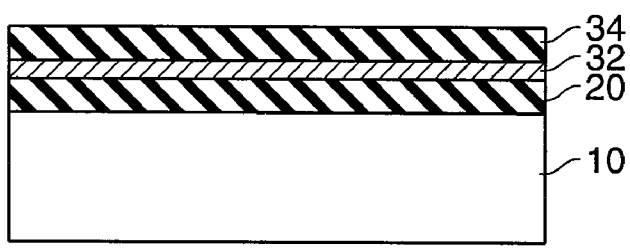
FIG. 3 is a schematic cross-sectional view of the piezoelectric element in an ink jet recording head in a manufacturing step in accordance with the embodiment of the invention.

(3) As shown in FIG. 3, a seed layer 34 is formed on the bottom electrode 32. The seed layer 34 is composed of compound with a layered perovskite structure, and its crystal orientation may preferably be in an a b axis or an a-axis, and more preferably be in an a-axis. As a result, the crystal orientation of the piezoelectric layer 36 formed on the seed layer 34 can be oriented in an a/b axis or an a-axis.

The seed layer 34 may be formed by a known method, such as, a sol-gel spin coating method or the like. When a spin coating method is applied, the rotation speed may be 500 rpm initially, and then increased to 1000-2000 rpm to prevent coating irregularity.

As the material for the seed layer 34, a composition expressed by a general formula $Bi_{1-x}Pr_xTi_3O_{12}$ may be used. It is noted that the value x in the formula may preferably be a number between 0.1 and 0.7, and more preferably between 0.1 and 0.5. When the value x is within the aforementioned range, the piezoelectric film formed on the seed layer can more readily be oriented in an a/b-axis or an a-axis. When the value x exceeds 0.7, the formation of the piezoelectric film n an a/b-axis or an a-axis orientation may become difficult.

The thickness of the seed layer may be 50 nm-200 nm. The seed layer is a layer for controlling the crystal orientation of a piezoelectric film to be formed thereon, and therefore it is desired to be as thin as possible. It may preferably be in a thickness in the aforementioned range.

Figure 4:
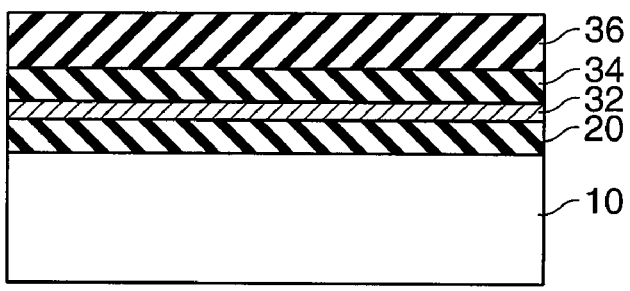
FIG. 4 is a schematic cross-sectional view of the piezoelectric element in an ink jet recording head in a manufacturing step in accordance with the embodiment of the invention.

(4) As shown in FIG. 4, a piezoelectric film 36 is formed on the seed layer 34.

As the material for the piezoelectric film 36, the BiTBBTi sol-gel liquid described above is used.

As a method for coating the piezoelectric film 36, the sol-gel liquid may be coated using a spin coating method or a dipping method. As the spin coating method or the dipping method, a generally practical method may be used. When a spin coating method is applied, the rotation speed may be, for example, 500 rpm initially, and then increased to 1000-2000 rpm to avoid coating irregularity (sol-gel liquid coating step).

After coating the sol-gel liquid on the seed layer 34, a heat treatment at the temperatures, for example, 10° C. higher than the boiling point of the solvent used in the sol-gel liquid is conducted using a hot plate or the like under the air atmosphere (drying heat treatment).

Then, in order to decompose and remove ligands of the organometallic compounds used in the sol-gel liquid, a heat treatment is performed in an air atmosphere using a hot plate or the like, for example, at temperatures of about 400° C.-600° C. (degrease heat treatment).

The sol-gel liquid coating step, the drying heat treatment step, and the degrease heat treatment step may appropriately be repeated to get the desired film thickness.

Then, an annealing step for crystallization of the piezoelectric layer 36, is conducted. The annealing may be conducted by, for example, RTA (Rapid Thermal Annealing), in an oxygen atmosphere at temperature 650° C.-800° C.

The thickness of the piezoelectric film may be, for example, 800-1500 nm. When the thickness of the piezoelectric film is within the aforementioned range, the piezoelectric films have good piezoelectric properties.

As the piezoelectric film 36 is formed on the seed layer 34, its crystal orientation can be aligned in an a/b axis or an a-axis. The crystal structure of the piezoelectric film 36 is in a superlattice structure in which $Bi_4Ti_3O_{12}$ layers with the number of $TiO_6$ octahedrons in the perovskite layer being three, and $BaBi_4Ti_4O_{15}$ layers with the number of $TiO_6$ octahedrons being four are alternately laminated. The superlattice structure is believed to be helpful to enhance the strain.

Furthermore, the Curie temperature of BiTBBTi is between the Curie temperature 675° C. of $Bi_4Ti_3O_{12}$ and the Curie temperature 410° C. of $BaBi_4Ti_4O_{15}$, which is adjacent to about 460° C. at which no any practical problem is given.

Figure 5:
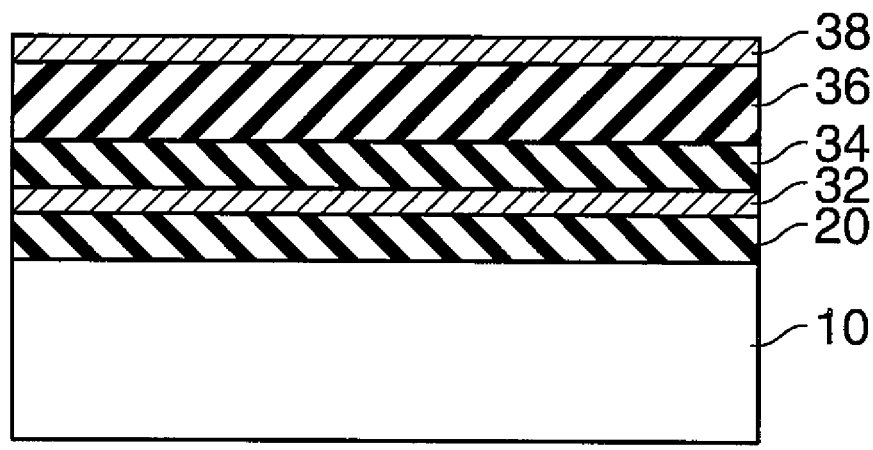
FIG. 5 is a schematic cross-sectional view of the piezoelectric element in an ink jet recording head in a manufacturing step in accordance with the embodiment of the invention.

As shown in FIG. 5, a top electrode 38 is formed on the piezoelectric film 36. The top electrode 38 may be formed using platinum or the like by a DC sputter method.

Figure 6:
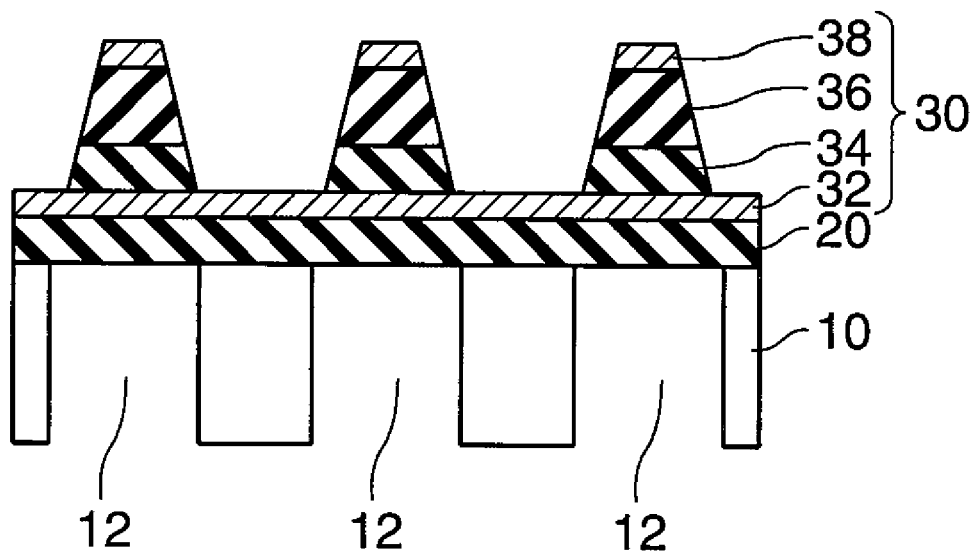
FIG. 6 is a schematic cross-sectional view of the piezoelectric element in an ink jet recording head in a manufacturing step in accordance with the embodiment of the invention.

As shown in FIG. 6, the seed layer 34, the piezoelectric film 36 and the top electrode 38 are processed in a predetermined shape, thereby forming piezoelectric elements 30. More specifically, resist is spin-coated on the top electrode 38, and the resist is patterned through exposing and developing at areas aligned with positions where pressure chambers are to be formed. By using the remaining resist layer as a mask, unnecessary portions of the seed layer 34, the piezoelectric film 36 and the top electrode 38 are removed by ion milling, dry etching or the like. By the steps described above, the piezoelectric elements 30 are formed.

On the other hand, portions of the pressure chamber substrate 10 where pressure chambers 12 are to be formed are removed by ion milling, dry etching or the like, thereby forming the pressure chambers 12.

In a manner described above, an ink jet recording head equipped with the piezoelectric elements in accordance with the present embodiment is fabricated.

3. Piezoelectric Element

A piezoelectric element in accordance with an embodiment of the invention consists of a bottom electrode, a seed layer formed on the bottom electrode with a composition expressed by a general formula $Bi_{1-x} Pr_x Ti_3O_{12}$ (x in the formula is a number between 0.1 and 0.7), a $Bi_4Ti_3O_{12}$—$BaBi_4Ti_4O_{15}$ piezoelectric film formed on the seed layer, and an top electrode formed on the piezoelectric film.

The piezoelectric element described above contains a lead-free BiTBBTi piezoelectric film with the crystal orientation aligned in an a/b-axis or an a-axis, which therefore provides significant piezoelectric characteristic that can match with PZT. Also, the Curie temperature of BiTBBTi is as high as about 460.degree. C., which ensures that the lead-free piezoelectric element can work even at the higher temperature than PZT element.

It is noted that the material and method for forming the bottom electrode and the top electrode may be the same as those described above.

Ferroelectric properties of BiTBBTi film oriented in an a/b axis were measured and the result thereof is shown below.

Figure 7:
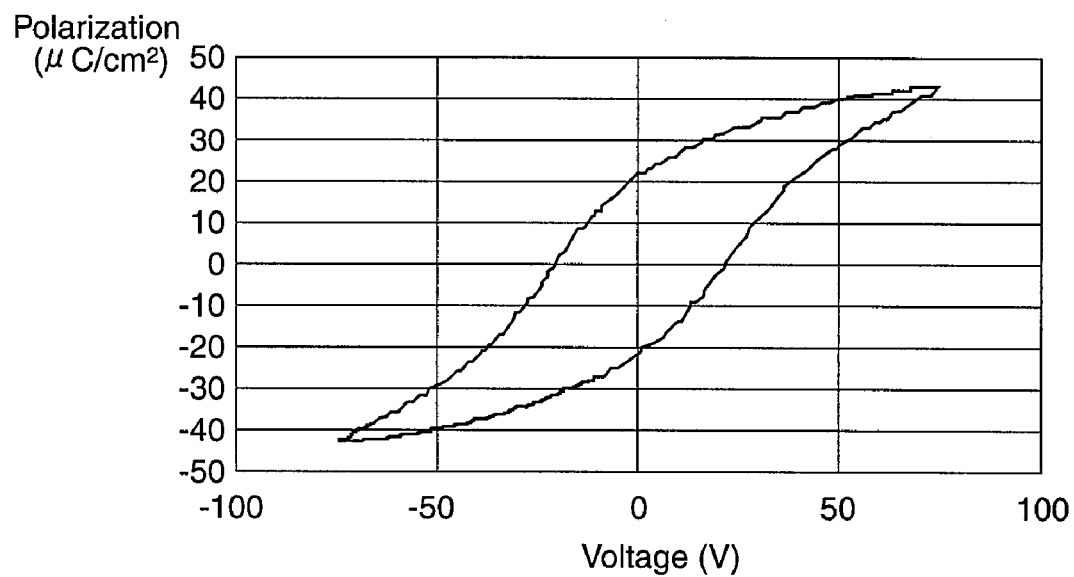
FIG. 7 is P-E hysteresis loop of $Bi_4Ti_3O_{12}$—$BaBi_4Ti_4O_{15}$ based film in the a/b axis orientation.

FIG. 7 shows P-E hysteresis loop of BiTBBTi film in an a/b axis orientation. It can be seen from FIG. 7 that the BiTBBTi film in an a/b axis orientation has excellent ferroelectric characteristic.

Figure 8:
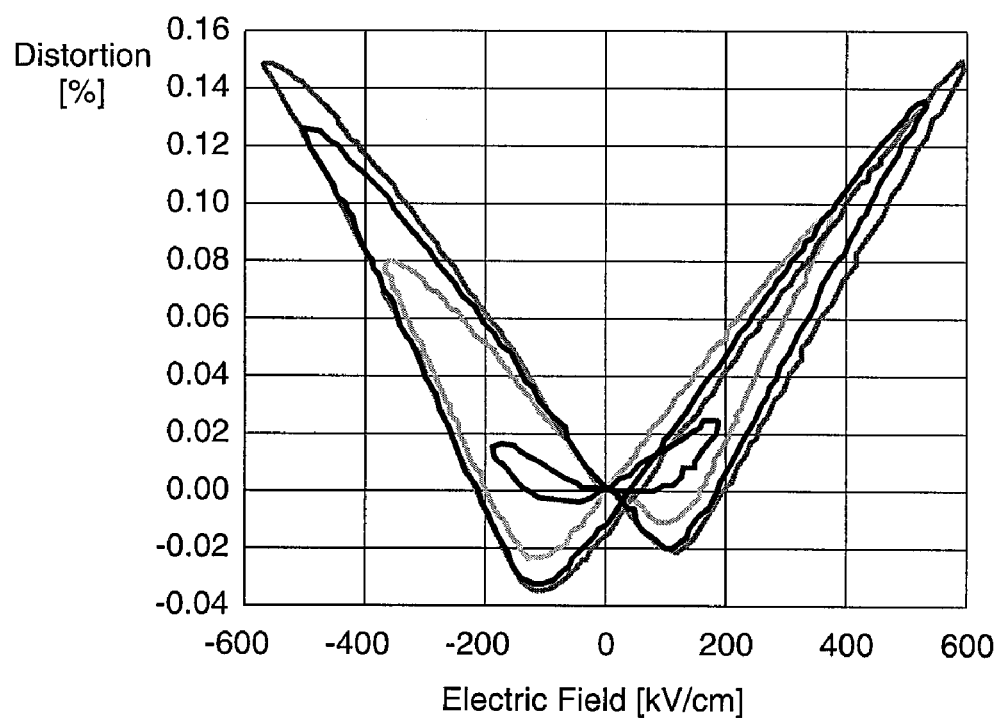
FIG. 8 is strain-field hysteresis loops of $Bi_4Ti_3O_{12}$—$BaBi_4Ti_4O_{15}$ based film in the a/b axis orientation.

FIG. 8 shows the result of strain-field of BiTBBTi film in an a/b axis orientation. The piezoelectric strain was measured using a double-beam type laser displacement meter. It can be seen from FIG. 8 that the BiTBBTi film orientated in an a/b axis has a large displacement.

The piezoelectric elements described above are applicable not only to ink jet recording heads described above, but also to piezoelectric actuators, piezoelectric sensors, piezoelectric resonators, and the like.

The present invention is not limited to the embodiments described above, and many modifications can be made. For example, the invention may include compositions that are substantially the same as the compositions described in the embodiment (for example, a composition with the same function, method and result, or a composition with the same objects and result). Also, the invention includes compositions in which portions not essential in the compositions described in the embodiment are replaced with others. Also, the invention includes compositions that achieve the same functions and effects or achieve the same objects of those of the compositions described in the embodiment. Furthermore, the invention includes compositions that include publicly known technology added to the compositions described in the embodiment.

What is claimed is:

1. A method of manufacturing a piezoelectric film element comprising the steps of:
    (a) forming a bottom electrode on a Si substrate;
    (b) forming a seed layer having a layered perovskite structure on the bottom electrode;
    wherein a composition of the seed layer is expressed by a general formula $Bi_{1-x} Pr_x Ti_3O_{12}$, wherein x in the formula is a number between 0.1 and 0.7;
    (c) forming a $Bi_4Ti_3O_{12}$—$BaBi_4Ti_4O_{15}$ based piezoelectric film on the seed layer;
    (d) forming a top electrode on the piezoelectric film.

2. A method for manufacturing a piezoelectric film element according to claim 1, wherein the piezoelectric film is formed by a sol-gel spin coating method or a sol-gel dipping method.

3. A method for manufacturing a piezoelectric film element according to claim 2, wherein the sol-gel liquid includes at least one of polymers selected from polyvinyl pyrrolidone, polyacrylic acid, polyethylene glycol, and polyvinyl alcohol.

4. A method for manufacturing a piezoelectric film element according to claim 3, wherein the average molecular weight of the polymer is between 300,000 and 1,500,000.

5. A method for manufacturing a piezoelectric film element according to claim 3, wherein the sol-gel liquid contains the polymer by 0.5-5 weight %.

6. A piezoelectric film element comprising:
a bottom electrode;
a seed layer formed on the bottom electrode having a composition expressed by a general formula $Bi_{1-x} Pr_x Ti_3 O_{12}$, wherein x in the formula is a number between 0.1 and 0.7;
a $Bi_4Ti_3O_{12}$—$BaBi_4Ti_4O_{15}$ based piezoelectric film formed on the seed layer a top electrode layer formed on the piezoelectric film.

7. A piezoelectric element according to claim 6, wherein the bottom electrode is composed of iridium.

8. A piezoelectric film element according to claim 6, wherein the top electrode is composed of platinum.

* * * * *